(12) United States Patent
Sameoto

(10) Patent No.: US 10,124,332 B2
(45) Date of Patent: Nov. 13, 2018

(54) REVERSIBLE BONDING OF MICROFLUIDIC CHANNELS USING DRY ADHESIVES

(71) Applicant: THE GOVERNORS OF THE UNIVERSITY OF ALBERTA, Edmonton (CA)

(72) Inventor: Daniel Elliot Sameoto, Edmonton (CA)

(*) Notice: Subject to any disclaimer, the term of this patent is extended or adjusted under 35 U.S.C. 154(b) by 387 days.

(21) Appl. No.: 14/724,123

(22) Filed: May 28, 2015

(65) Prior Publication Data

US 2015/0343442 A1 Dec. 3, 2015

Related U.S. Application Data

(63) Continuation-in-part of application No. 14/308,635, filed on Jun. 18, 2014, which is a continuation-in-part (Continued)

(51) Int. Cl.
| | |
|---|---|
| *B01L 3/00* | (2006.01) |
| *B29C 59/00* | (2006.01) |
| *B29C 33/38* | (2006.01) |
| *B29C 33/40* | (2006.01) |
| *B81C 99/00* | (2010.01) |

(Continued)

(52) U.S. Cl.
CPC .... *B01L 3/502715* (2013.01); *B29C 33/3878* (2013.01); *B29C 33/405* (2013.01); *B29C 59/00* (2013.01); *B81C 3/001* (2013.01); *B81C 99/009* (2013.01); *B01L 2400/0421* (2013.01); *B29C 33/3842* (2013.01); *B29C 33/42* (2013.01); *B29C 41/003* (2013.01); *B29C 47/0004* (2013.01); *B29C 47/0021* (2013.01); *B29K 2833/12* (2013.01); *B29K 2883/00* (2013.01); *B29K 2995/0098* (2013.01); *B29L 2007/00* (2013.01); *B29L 2009/00* (2013.01); *B81B 2201/058* (2013.01); *C09J 2201/626* (2013.01);

(Continued)

(58) Field of Classification Search
CPC .................................................. B01L 3/502715
See application file for complete search history.

(56) References Cited

U.S. PATENT DOCUMENTS

| | | | | |
|---|---|---|---|---|
| 2006/0078470 A1* | 4/2006 | Zhou | ..................... | B01F 5/0683 422/503 |
| 2010/0136281 A1* | 6/2010 | Sitti | .................... | A44B 18/0049 428/92 |

* cited by examiner

*Primary Examiner* — Krishnan S Menon
*Assistant Examiner* — Dwan A Gerido
(74) *Attorney, Agent, or Firm* — Palmer IP Inc.

(57) ABSTRACT

A reversible bonded microfluidic structure comprises an overhanging cap or gasket structure atop a continuous microfluidic channel wall. An overhanging gasket structure may reduce stress concentrations at the edge of the channel wall and can permit improved reversible adhesion of the channel wall and adjacent dry adhesive fibers. In one example, reversible adhesion of the overhanging channel wall gasket and adjacent dry adhesive fibers may approach 1 MPa in axial loading. An overhanging gasket structure of the microfluidic channel wall may comprise a single "fiber" that is continuous around the perimeter of the desired microfluidic channel shape, and may define a self-sealing gasket which will contain fluid. The overhanging gasket structure may be surrounded by further overhanging or undercut dry adhesive fibers to enhance the adhesion and help make the rest of the surface more tolerant to defects and surface roughness.

6 Claims, 9 Drawing Sheets

Related U.S. Application Data of application No. 14/187,927, filed on Feb. 24, 2014, which is a continuation of application No. 12/905,065, filed on Oct. 14, 2010, now Pat. No. 8,703,032.

(60) Provisional application No. 62/004,090, filed on May 28, 2014, provisional application No. 61/254,667, filed on Oct. 24, 2009, provisional application No. 61/292,835, filed on Jan. 6, 2010, provisional application No. 61/836,573, filed on Jun. 18, 2013.

(51) Int. Cl.
*B81C 3/00* (2006.01)
*B29C 33/42* (2006.01)
*B29C 47/00* (2006.01)
*B29C 41/00* (2006.01)
*B29L 7/00* (2006.01)
*B29L 9/00* (2006.01)

(52) U.S. Cl.
CPC .. *Y10T 137/6851* (2015.04); *Y10T 428/23957* (2015.04)

REVERSIBLE BONDING OF MICROFLUIDIC CHANNELS USING DRY ADHESIVES

CROSS-REFERENCE TO RELATED APPLICATIONS

The present application is a non-provisional application and claims priority to and benefit of U.S. Provisional Patent Application No. 62/004,090 filed May 28, 2014 and entitled REVERSIBLE BONDING OF MICROFLUIDIC CHANNELS USING DRY ADHESIVES, the contents of which are hereby incorporated by reference in their entirety for all purposes. This application further claims priority to and benefit of U.S. patent application Ser. No. 14/308,635 filed Jun. 18, 2014 and entitled COMPRESSION, EXTRUSION AND INJECTION MOLDING OF INTERLOCKING DRY ADHESIVE MICROSTRUCTURES WITH FLEXIBLE MOLD TECHNOLOGY, the contents of which are hereby incorporated by reference in their entirety for all purposes. This application also further incorporates by reference previously filed U.S. Provisional Patent Application No. 61/836,573 filed Jun. 18, 2013, and entitled COMPRESSION, EXTRUSION AND INJECTION MOLDING OF INTERLOCKING DRY ADHESIVE MICROSTRUCTURES WITH FLEXIBLE MOLD TECHNOLOGY, the entire contents of which are herein incorporated by reference in their entirety for all purposes.

FIELD OF THE INVENTION

The present invention relates generally to microfluidic channel structures capable of reversible bonding to a surface. More particularly, the present invention relates to microfluidic channel structures adapted for reversible bonding to a surface and comprising dry adhesive structures, and more particularly dry adhesive structures such as interlocking dry adhesive microstructures, and more particularly compression, extrusion and/or injection molded dry adhesive structures.

BACKGROUND TO THE INVENTION

Microfluidic structures which may be adhered or sealed to a substantially planar underlying surface are known in the art for implementing microfluidic systems at varying scales. Reversibly sealed microfluidic structures such as reversibly sealed polydimethylsiloxane based ("PDMS") microfluidics have been proposed to address bonding challenges associated with conventional microfluidics formed from rigid thermoplastic materials. Unfortunately, reversible bonding with PDMS is also problematic, because the channels typically cannot hold desirably high fluid pressures for desired microfluidic applications. On the contrary, reversible microfluidic bonding with known elastomer materials is typically very weak as is discussed for example in the publication entitled "Prototyping of microfluidic devices in poly(dimethylsiloxane) using solid-object printing" to McDonald et al., Anal. Chem., 74, 1537, (2002). For a typical reversible bonded channel in a conventional elastomer based microfluidic system, a channel wall simply meets the bonded surface with a flat punch type contact tip at an angle of approximately 90°. This type of geometry is typically vulnerable to stress concentrations at the contact edge which will cause much earlier adhesive failure than the theoretical strength possible via van der Waals forces. It is therefore desirable to provide for reversibly bonded microfluidic channel structures having improved bonding characteristics so as to address some of the limitations of the prior art.

SUMMARY OF THE INVENTION

According to one embodiment of the present invention, a reversible bonded microfluidic structure is provided comprising an overhanging cap or gasket structure atop a continuous microfluidic channel wall. In one such embodiment, the overhanging gasket structure may desirably reduce stress concentrations at the edge of the channel wall and can desirably permit improved reversible adhesion of the channel wall and adjacent dry adhesive fibers. In a particular such embodiment, the reversible adhesion of the overhanging channel wall gasket and adjacent dry adhesive fibers may desirably approach 1 MPa in axial loading.

According to another embodiment, an overhanging gasket structure of the microfluidic channel wall may comprise a single "fiber" that is continuous around the perimeter of the desired microfluidic channel shape, and may desirably define a self-sealing gasket which will contain fluid. This overhanging gasket structure may desirably be surrounded by further overhanging or undercut dry adhesive fibers to enhance the total adhesion and help make the rest of the surface more tolerant to defects and surface roughness. This mechanism strongly improves the total performance of the reversible bond attaching the microfluidic structure to an underlying surface. In one such embodiment, the overhanging gasket structure may desirably be raised above the height of the surrounding or adjacent overhanging or undercut dry adhesive fibers such as to provide a compressive force conforming the overhanging gasket structure to an underlying surface to which it is attached, such as may be beneficial in certain exemplary applications for containing fluids that have lower surface tensions including alcohols and oils, for example.

According to one embodiment of the present invention, a method of manufacturing a reversible bonded microfluidic structure is provided. Such method may comprise the steps of:

applying a photoresistive material to a polymethyl methacrylate mold substrate;

patterning and developing the photoresistive material to form a mask comprising a continuous microfluidic channel wall with overhanging gasket structure and adjacent undercut dry adhesive cap structures;

exposing the polymethyl methacrylate mold substrate to UV light;

developing the polymethyl methacrylate mold substrate to form a continuous microfluidic channel wall with overhanging gasket structure and dry adhesive fiber structures;

molding a silicone rubber or other flexible elastomer material in the polymethyl methacrylate mold substrate to form a silicone rubber or flexible elastomer negative mold of said microfluidic structure; and molding a suitable flexible polymer material in the silicone rubber or flexible elastomer negative mold to form the reversible bonded microfluidic structure comprising the continuous microfluidic channel wall with overhanging gasket structure and adjacent dry adhesive cap structures. In a particular embodiment, the flexible polymer material may comprise a thermoplastic polymer material molded under heat and pressure to form the reversible bonded microfluidic structure.

In one aspect of the present invention, a reversible bonded microfluidic structure according to a method herein disclosed may desirably provide strong resistance to leakage. In another aspect, a reversible bonded microfluidic structure according to a method herein disclosed may further desirably provide for easy integration with electrodes.

In yet another aspect of the present invention, a reversible bonded microfluidic structure according to a method herein disclosed may desirably provide for bonding to any relatively smooth surface with minimal effort, and may further desirably provide for integration with CMOS or silicon MEMS with few modifications.

In an alternative embodiment, the method of manufacturing a reversible bonded microfluidic structure may comprise depositing, embossing, stamping, direct printing, lithography, or otherwise patterning a non-photosensitive material onto the mold substrate to form a mask comprising a continuous microfluidic channel wall with overhanging gasket structure and adjacent dry adhesive cap structures.

According to another embodiment of the present invention, a reversible bonded microfluidic structure consisting of a flexible polymer material is provided. The flexible polymer microfluidic structure comprises:
  a base structure;
  a continuous microfluidic channel wall with an overhanging gasket structure forming at least one microfluidic channel or chamber;
  a plurality of dry adhesive fiber structures substantially adjacent to the microfluidic channel wall and extending from said base structure; and
  a plurality of overhanging cap structures corresponding to and situated atop said fiber structures adapted for reversible bonding of said microfluidic structure to a support surface. In a particular embodiment, the reversible bonded microfluidic structure may comprise a thermoplastic microfluidic structure, and the flexible polymer material may comprise a thermoplastic polymer material. In one such embodiment, at least a portion of the dry adhesive fiber structures may be desirably hydrophilic, such as formed from a substantially hydrophobic material. In another such embodiment, at least a portion of the overhanging cap structures corresponding to and situated atop the fiber structures may be desirably hydrophobic, such as formed from a substantially hydrophobic material, for example.

According to a further embodiment of the present invention, a method of manufacturing a reversible bonded microfluidic structure is provided. In one such embodiment, the method comprises the steps of:
  providing a flexible elastomer negative mold comprising a negative continuous microfluidic channel wall comprising an overhanging gasket structure forming at least one microfluidic channel and adjacent undercut dry adhesive cap structures;
  molding a thermoplastic polymer material in the flexible elastomer negative mold under application of heat and pressure;
  allowing the thermoplastic polymer material to cool; and
  flexibly demolding the flexible elastomer negative mold from the thermoplastic polymer material to release the reversible bonded microfluidic structure comprising a negative continuous microfluidic channel wall comprising an overhanging gasket structure forming at least one microfluidic channel and adjacent undercut dry adhesive cap structures.

DETAILED DESCRIPTION OF SEVERAL EMBODIMENTS

Figure 1:
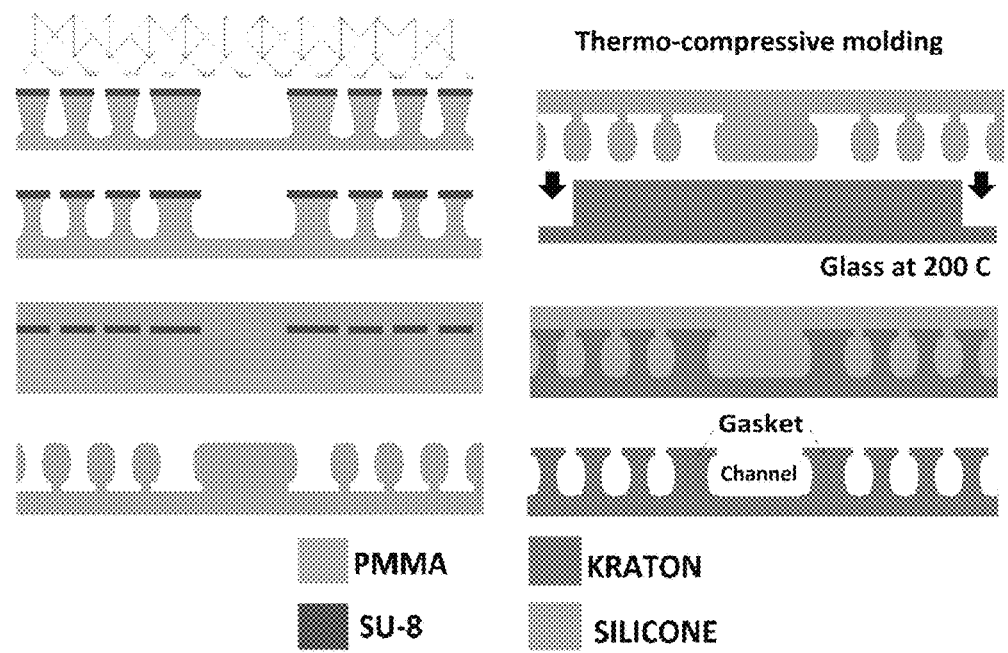
FIG. 1 illustrates a schematic view of a manufacturing process for manufacturing reversible bonded thermoplastic microfluidic structures according to an embodiment of the present invention.

According to one embodiment of the present invention, a method of manufacturing a reversible bonded microfluidic structure is provided that uses semi-collimated UV light exposure to produce master molds for a reversible bonded microfluidic structure comprising one or more microfluidic channels having a continuous channel wall with overhanging gasket structure, and optionally also overhanging or interlocking dry adhesive structures substantially adjacent to the microfluidic channel wall gasket structures, to desirably provide for enhanced bonding to a suitable surface.

In one embodiment of the present invention, a fabrication method is provided that uses deep UV exposures such as from germicidal lamps or other suitable UV sources to convert commercial acrylic substrates (such as polymethylmethacrylate or "PMMA" for example) into master molds for reversible bonded microfluidic structures. Overhanging or interlocking microfluidic channel wall gasket structures and optional adjacent dry adhesive structures are inspired by the fibrillar structures found on the feet of geckos and certain spiders, and may desirably provide for multiple overhanging adhesion surfaces (also referred to as "caps") which may conform and adhere to other surfaces primarily through van der Waals interactions. An advantage of the present fabrication method of such embodiment is in the scale of the patterning that it can achieve, with the capabilities of making repeatable and customizable reversible bonded microfluidic structures for a variety of applications and potential mold sizes. In one embodiment of the present invention, the reversible bonded microfluidic structure molding technology may be used to scale up individual mold sizes, or may optionally also be appropriate for continuous casting such as by combining multiple molds, or roller molds or other suitable roll-to-roll casting techniques.

The use of 254 nm UV light exposures have previously been made for thin polymethylmethacrylate (PMMA) lithography and MEMS. However, in an embodiment of the present invention, PMMA lithography by UV (such as 254 nm) light exposure may be implemented in a simple method to produce detailed reversible bonded microfluidic structures on commercial acrylic substrates which may comprise primarily PMMA and additives, and optionally also other suitable known acrylic materials. By using bulk acrylic (such as PMMA) to produce positive molds for subsequent reversible bonded microfluidic structure designs, this process according to one aspect of the present invention may be used to design a master mold in a relatively stiff material that may be used for optimizing the geometry of subsequently cast reversible bonded microfluidic structures.

In one such method according to an aspect of the present invention, a thin layer of SU-8 (or optionally another suitable photoresist material) is spun on or otherwise applied to a commercial acrylic substrate (such as OPTIX® PMMA from Plaskolite™), pre-baked, exposed, post-baked and developed. SU-8 is nearly opaque to 254 nm light, and serves as a deep UV mask and as a cap on the top of acrylic microfluidic channel wall and dry adhesive fiber structures. A Stratagene™ 2400 DNA crosslinker or other suitable 254 nm light source may then be used, alone or optionally in combination with anti-scatter grids which may desirably have aspect ratios of between about 1:1 and 2:1. Acrylic samples are placed on a rotating turntable during exposure to equalize the UV light dose received through the anti-scatter grids. This system combined with the natural reduction of angle by Snell's Law may desirably produce elongate acrylic fibers, such as fibers with aspect ratios desirably above about 4:1 for example (see FIG. 2) substantially evenly across large areas. In one such embodiment, UV light exposure may be substantially uncollimated. In another embodiment, a semi-collimated or collimated UV light source may be used to expose the photoresist material.

Optional use of anti-scatter grids in an optional embodiment may desirably reduce the negative sidewall angles and improve the aspect ratio of fibers produced in acrylic. In one embodiment, semi-collimation of large-area 254 nm exposures may be achieved by the introduction of simple anti-scatter grids between the light bulbs and the acrylic substrate. For large-area exposures in certain embodiments of the present invention however, an anti-scatter grid with an aspect ratio as small as 1:1 can produce a much diminished negative sidewall angle with an acceptable increase in exposure time compared to uncollimated exposures. This is partially due to the effect of Snell's law aiding in the reduction in sidewall angle by reducing the light angle as it passes from air to the higher index of refraction acrylic substrate. For higher aspect ratio anti-scatter grids, the further improvement of sidewall angle due to Snell's law is reduced, and the ultimate aspect ratio of features may approach that of the anti-scatter grid. The anti-scatter grids used in embodiments of the present invention may be made of plastic grating commonly found in industrial or commercial lighting over fluorescent bulbs. On exemplary single level grating was approximately 12.5 mm thick, with square holes 12×12 mm in size and ~1 mm thick walls providing a ~1:1 aspect ratio grid. Two such gratings may be stacked to form a 2:1 aspect ratio grid. In another optional embodiment, the UV exposure may be at least partially collimated using other suitable collimation means.

In one embodiment, the UV exposure may desirably lower the molecular weight of the acrylic substrate so that it may be removed rapidly in developers, such as known acrylic and/or photoresist developing solutions, for example. In one embodiment of the present inventive method, it has been established that SU-8 developer provides a suitable combination of convenience, speed, and natural undercutting of the SU-8 structures on the surface of the substrate when used to develop the exposed acrylic. Because exemplary acrylic materials such as OPTIX® PMMA acrylic material have a relatively low molecular weight, the unexposed acrylic material will preferentially dissolve at a controllable rate which may be controlled by adjusting the temperature of the solvent and particular molecular weight of the acrylic material, to form desirably undercut mushroom shaped acrylic fibers. In one embodiment, the relatively low molecular weight OPTIX® acrylic material may be controlled to preferentially dissolve at approximately 60 nm per minute—forming desirably mushroom shaped acrylic fibers, for example. In another embodiment, the temperature of the solvent may be desirably controlled to adjust the effective preferential dissolution rate of the exposed acrylic, such as to allow for adjustment of the desired undercutting rate during development.

In such embodiment, once the required master shapes (such as the reversible bonded microfluidic channel wall and overhanging gasket structures and/or dry adhesive acrylic fiber and overhanging cap structures) are completed out of acrylic and SU-8 materials, a negative mold may be made of the a reversible bonded microfluidic structure by casting of a suitable silicone-based or other suitable pliable or flexible molding material such as a suitable flexible elastomer material. After such flexible negative mold, such as a flexible negative silicone mold or flexible elastomer negative mold is made, multiple materials may be cast from this mold in the shape of the original a reversible bonded microfluidic structure designs to produce the desired reversible bonded microfluidic structure. In one embodiment, exemplary such materials which may be cast to form a reversible bonded microfluidic structures include any suitable flexible polymer material which may be suitably casted in the flexible negative mold to produce the desired reversible bonded microfluidic structure. In a particular embodiment, substantially stiffer and less pliable materials such as substantially rigid or partially flexible polymer materials and including castable thermoplastic materials which may be molded in the flexible negative mold such as by thermal compression, extrusion and/or injection molding involving application of heat and pressure to compress, extrude and/or inject the thermoplastic material into the flexible mold to produce the desired reversible bonded microfluidic structure. In one such embodiment, a suitable thermoplastic material, such as a thermoplastic elastomer or other thermoplastic polymer, may desirably be meltable and reformable at a desired temperature range for casting of the desired reversible bonded microfluidic structure in the flexible negative mold, and may desirably comprise a suitable flow rate at a desired processing temperature and also at a desirably low shear rate in order to provide for extrusion, compression molding or injection molding in the flexible negative mold.

In another embodiment, the method may comprise extruding a substantially molten film of a suitable thermoplastic material, which may thereafter be cast in a flexible mold such as by injection and/or compression molding under application of heat and pressure. In a particular embodiment, a suitable thermoplastic material may comprise a desirably high melt flow index, wherein higher melt flow index values may typically be preferable to provide for improved casting under low shear rates at a particular desired processing temperature, for example. In a preferred embodiment, the method may desirably provide for casting of the thermoplastic material in the flexible negative mold to produce reversible bonded microfluidic structures within a range of processing temperatures such that the casting temperature is above a higher glass transition temperature of at least one component of the thermoplastic material, and that the desired reversible bonded microfluidic structures are set within the flexible negative mold at a setting temperature below a lower glass transition temperature of at least one component of the thermoplastic material. In a particular preferred embodiment, the setting of the desired reversible bonded microfluidic structures may also desirably be conducted at a setting temperature or range of temperatures where the flexible negative mold is desirably substantially unstressed, such as to desirably reduce deformation of the final set desired reversible bonded microfluidic structures including the continuous microfluidic channel wall with overhanging gasket features and dry adhesive fiber and overhanging cap features, for example. In another embodiment, the flexible negative mold material and thermoplastic materials may desirably be selected such that their thermal shrinkage/expansion rates may be substantially similar over the casting and/or setting temperature ranges of the compression, extrusion and/or injection molding process, such as to desirably reduce shrinkage/expansion stresses in the desired reversible bonded microfluidic structure.

In a particular embodiment of the inventive method comprising compression, extrusion and/or injection molding of thermoplastic elastomer reversible bonded microfluidic structures in a negative flexible mold under application of heat and pressure, a non-melting backing layer of a suitable non-melting material may desirably be applied to the thermoplastic elastomer material during the casting process under pressure. In a particular embodiment, the non-melting backing material may also comprise wetting properties with respect to the thermoplastic elastomer material. In one such embodiment, a suitable non-melting backing layer comprising glass, aluminum or other non-melting polymer material such as a Kapton® or other suitable non-melting polyimide film layer, may be desirably applied to the thermoplastic elastomer material during casting under pressure and heat, such as to desirably maintain expansion of the thermoplastic elastomer material in place within the flexible mold during casting and setting of the reversible bonded microfluidic structures, for example.

In one exemplary embodiment, a Kraton® G1657 and/or Kraton® G1645 thermoplastic material may be used to cast reversible bonded microfluidic structures within a flexible negative silicone rubber (such as a TC-5030 silicone rubber from BJB Enterprises) mold, at a casting temperature of greater than about 160 C and more preferably about 170 C to about 230 C, and under a suitable casting compression pressure above ambient or atmospheric pressure levels. In a particular such compression molding embodiment, a casting pressure for casting interlocking dry adhesive structures may be applied (such as by an ultrasonic welder apparatus without application of ultrasonic energy which may be operable to apply between 15-450 lbs force on a hotplate) between heated plates such as a hotplate, above and below the thermoplastic material and flexible mold, such as to compress the thermoplastic material into the flexible mold to cast desired reversible bonded microfluidic structures. In a particular embodiment, the thermoplastic material may be provided as pellets and pre-heated and/or melted on a glass or hot plate surface before casting, or in another embodiment, the thermoplastic material may be extruded in a film and the heated plates above and below the thermoplastic adhesive material may be provided in a continuous roll, such as to provide for a substantially continuous casting process. In such an embodiment, suitable thermoplastic reversible bonded microfluidic structures may be desirably cast in an exemplary flexible mold using compression molding, with a replication time including setup, casting, cooling and demolding, of about two (2) minutes or less, and more preferably about 30 seconds, for example. In another embodiment using an injection molding technique, a thermoplastic material having suitable viscosity properties at a desired casting temperature range may be cast into reversible bonded microfluidic structures in a suitable flexible negative mold, such as to provide a desirably rapid method of injection molding of thermoplastic reversible bonded microfluidic structures under application of heat and pressure.

Referring to FIG. 1, a schematic view of an exemplary manufacturing process for manufacturing reversible bonded thermoplastic microfluidic structures comprising one or more microfluidic channels is illustrated, according to a particular embodiment of the present invention. In one such method, a first step may comprise applying a photoresistive material such as SU-8 to a suitable acrylic (such as commercial polymethyl methacrylate or PMMA) mold substrate, followed by patterning and developing the photoresistive material to form a mask comprising a continuous microfluidic channel wall with overhanging gasket structure and adjacent undercut dry adhesive cap structures. In one such embodiment, the continuous microfluidic channels may range in depth such as from 1-10 um to more than 100 um in depth, as may be desirable for a variety of microfluidic applications, for example.

The masked acrylic mold substrate material may then be exposed to UV light, such as to a deep UV, and more particularly a semi-collimated 254 nm UV light source, and subsequently developed to form a master mold with at least one continuous microfluidic channel wall with overhanging gasket structure feature and optionally also dry adhesive fiber structures substantially adjacent to the channel wall feature. The acrylic master mold may then be used to mold a suitable flexible elastomer material, such as a suitable silicone rubber material (such as TC-5030 silicone rubber from BJB Enterprises) in the acrylic mold substrate to form an elastomer such as silicone rubber negative mold of the microfluidic channel structure. The flexible elastomer or silicone rubber negative mold may then be used to mold a suitable flexible polymer material in the negative mold to form the reversible bonded microfluidic channel structure comprising the continuous microfluidic channel wall with overhanging gasket structure and optional adjacent dry adhesive cap structures. In a particular embodiment, the flexible polymer material may comprise a suitable thermoplastic polymer material molded under heat and pressure to form the reversible bonded microfluidic structure.

In yet a further particular embodiment, the flexible polymer material may comprise a thermoplastic elastomer that may desirably flow well at elevated temperatures such as to desirably provide for molding of overhanging and interlocking channel wall gasket and/or adjacent dry adhesive structures. In one such embodiment, the flexible polymer material may comprise a styrene-ethylene-butylene-styrene (SEBS) elastomer such as Kraton G1657 and/or Kraton G1645, for example. In a particular such embodiment, a suitable thermoplastic elastomer material may be provided as resin pellets and may be heated and/or melted to a desired molding temperature, such as on a glass surface at 200 C for example, and then may be thermocompressively molded in the negative mold by application of a desired molding force for a desired molding time, such as from 30 seconds to 2-3 minutes, for example, as may be required by the particular thermoplastic elastomer material. In one such embodiment, an ultrasonic welder apparatus, such as a Branson ultrasonic welder, may be used without application of ultrasonic energy to apply between 15-450 lbs of compressive force on a preheated hotplate containing the negative silicone mold and thermoplastic elastomer pucks, to thermocompressively mold the reversible bonded microfluidic structure. Following molding, the reversible bonded microfluidic structure and negative mold may be allowed to cool and the reversible bonded microfluidic structure may be flexibly demolded such as by peeling from the silicone negative mold and glass support surface to yield the finished reversible bonded microfluidic structure, which may be reversibly bonded to any suitable substantially smooth surface for microfluidic use.

Figure 2:
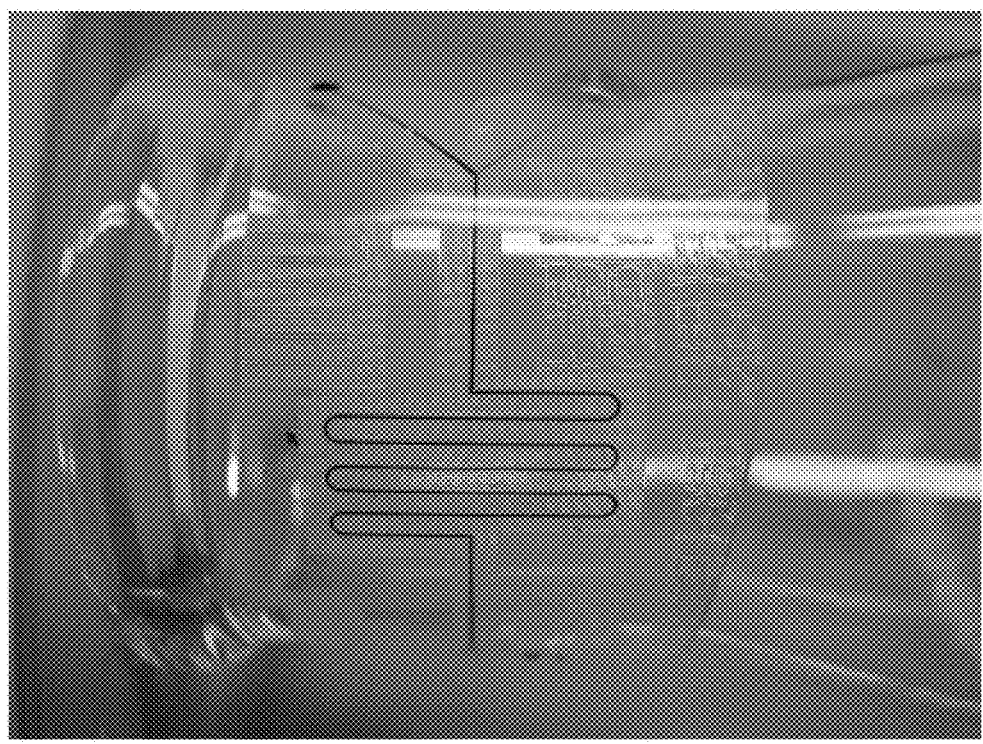
FIG. 2 illustrates a close-up perspective view of a reversible bonded microfluidic structure comprising a micro-mixer according to an embodiment of the present invention, which is reversibly attached to the neck of an Erlenmeyer flask.

Referring to FIG. 2, a close-up perspective view of a reversible bonded microfluidic structure is illustrated, comprising a micro-mixer according to an embodiment of the present invention, and which is reversibly attached to the neck of an Erlenmeyer flask. In one embodiment, one or more microfluidic reservoirs molded in the reversible bonded microfluidic structure may be opened or otherwise accessed such as by puncturing and/or punching through the surface of the thermoplastic microfluidic structure materials, or alternatively microfluidic reservoirs may be bonded over holes through the thermoplastic microfluidic structure material such as to provide for filling of the reversible bonded microfluidic structure with one or more desired fluids. In the embodiment illustrated in FIG. 2, the micro-mixer reversible bonded microfluidic structure may comprise at least two reservoirs containing different food dyes or other desired fluids to be mixed. In one such embodiment, gravity driven flow may desirably assist in filling the microfluidic channels of the reversible bonded microfluidic structure while keeping large drops contained in the reservoir and/or on the top surface of the reversible bonded microfluidic structure, for example. In one exemplary embodiment, the scale bar shown in FIG. 2 may represent 1 cm.

Figure 3:
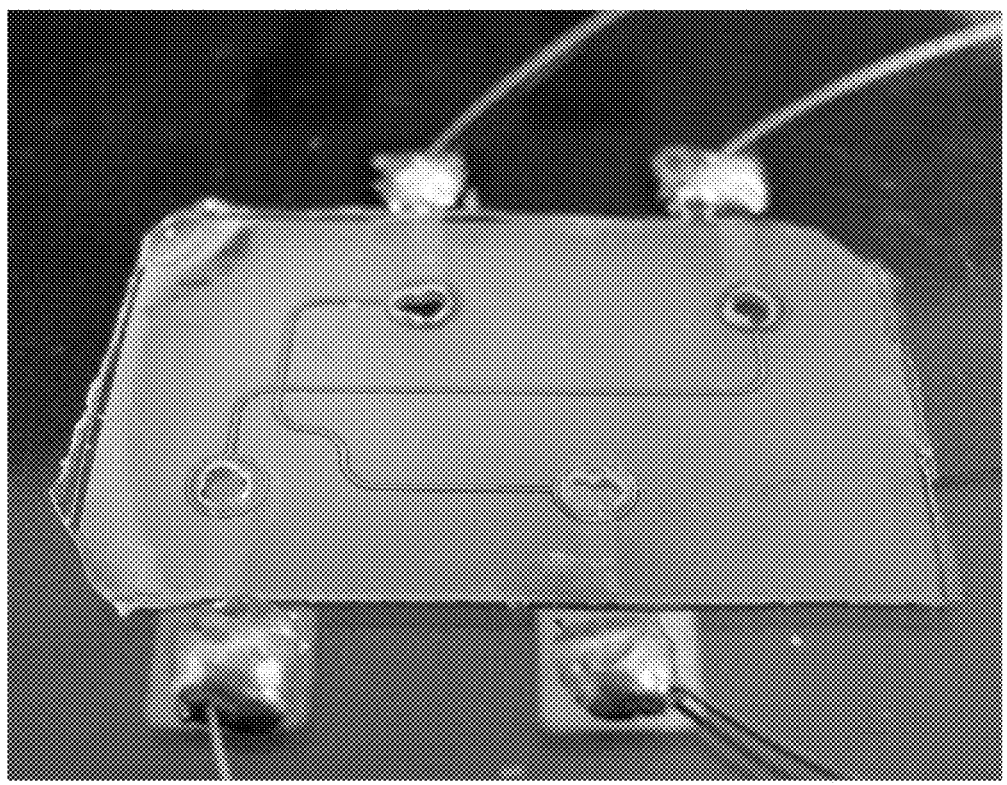
FIG. 3 illustrates a close-up perspective view of a reversible bonded microfluidic structure comprising a capillary electrophoresis channel design according to an embodiment of the present invention, with microfluidic channels which are reversibly bonded on top of electrodes.

Referring to FIG. 3, a close-up perspective view of a reversible bonded microfluidic structure comprising a capillary electrophoresis channel design is illustrated, according to an embodiment of the present invention, with microfluidic channels which are reversibly bonded on top of electrodes. In one embodiment, one or more microfluidic reservoirs molded in the reversible bonded microfluidic structure may be opened or otherwise accessed such as by puncturing and/or punching through the surface of the thermoplastic microfluidic structure material, or alternatively microfluidic reservoirs may be bonded over holes through the thermoplastic microfluidic structure materials such as to provide for filling of the reversible bonded microfluidic structure with one or more desired electrophoresis fluids, for example. In one exemplary embodiment, a polystyrene petri dish lid was sputtered with 20 nm of gold through a stencil to form electrodes to match the microfluidic reservoirs of a reversible bonded microfluidic structure comprising capillary electrophoresis channels, and wires were soldered to the electrodes using Field's metal to produce the capillary electrophoresis microfluidic apparatus. In a further embodiment, an exemplary reversible bonded microfluidic structure may be bonded to one or more electrodes for use in other electrokinetic applications such as electrokinetic separation applications, for example.

Figure 4:
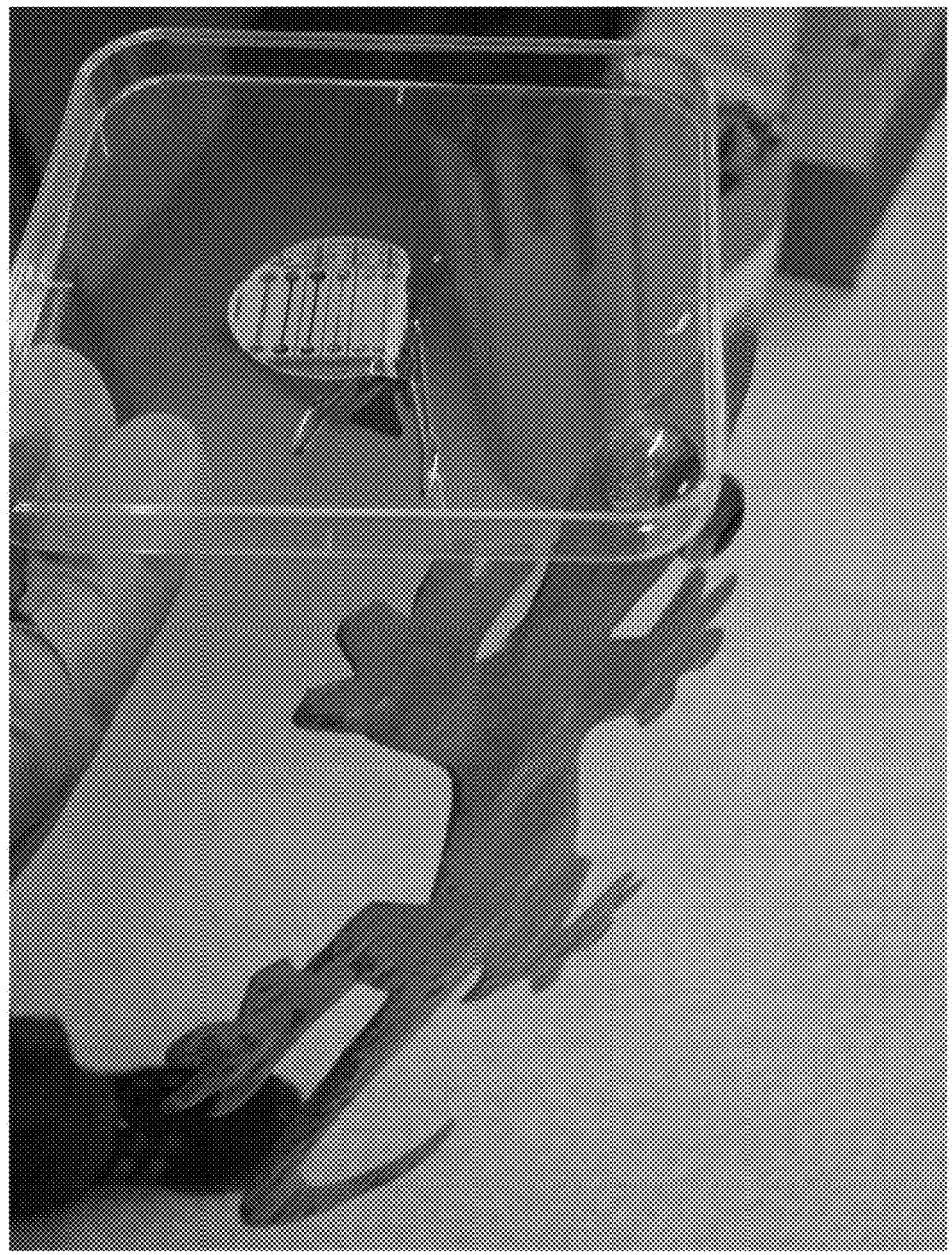
FIG. 4 illustrates a close-up perspective view of a reversible bonded microfluidic structure comprising multiple dyed channels according to an embodiment of the present invention, reversibly bonded to a glass surface and supporting a peeling load of 75 g.
Figure 5:
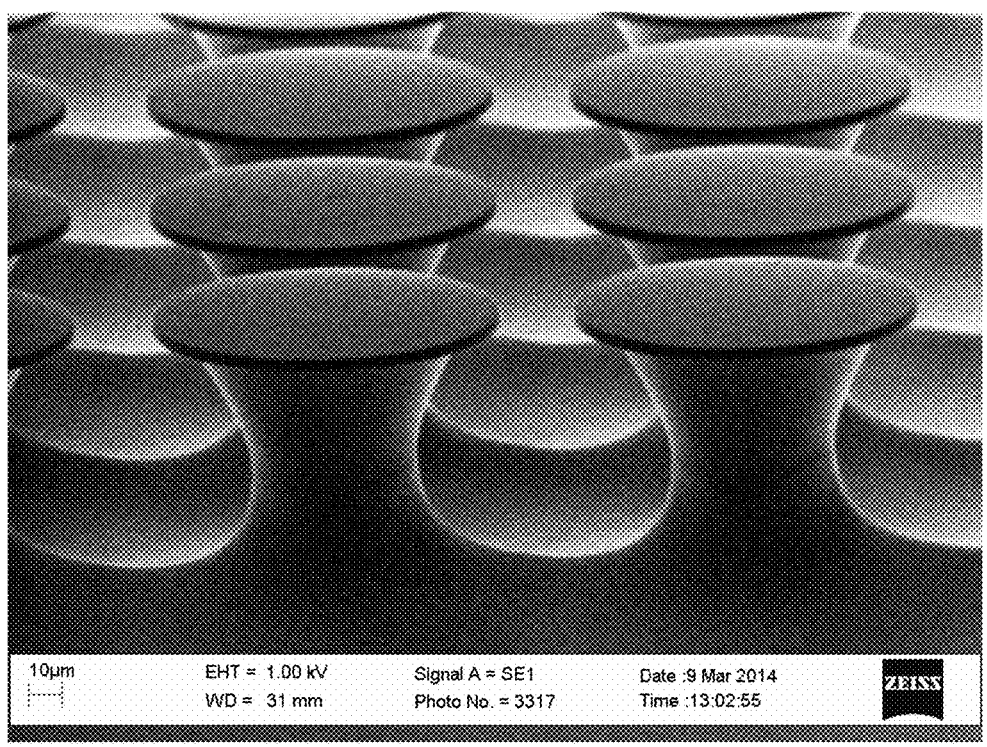
FIG. 5 illustrates a scanning electron micrograph perspective view of representative thermoplastic dry adhesive fibers or pillars with overhanging cap structures as part of a reversible bonded microfluidic structure according to an embodiment of the invention.

Referring to FIG. 4, a close-up perspective view of a reversible bonded microfluidic structure is illustrated, comprising multiple dyed channels according to an embodiment of the present invention, reversibly bonded to a glass surface and supporting a peeling load of 75 g. In one such embodiment, the use of substantially consistently formed and suitably dimensioned overhanging or interlocking cap dry adhesive fiber and pillar designs applied in SEBS thermoplastic materials, such as those illustrated in FIG. 5, may desirably provide for increased reversible peel strength of the reversible bonded microfluidic structures according to an embodiment of the present invention. In one such embodiment comprising deeper microfluidic flow channels in a particular reversible bonded microfluidic structure, larger dry adhesive pillars and overhanging caps substantially adjacent to the microfluidic channel wall and its overhanging gasket structure may be desirable such as to provide increased adhesion and to desirably reduce stress concentration at points of contact of the dry adhesive fibers and caps. In another embodiment, the overhanging gasket structure may desirably be raised above the height of the surrounding or adjacent overhanging or undercut dry adhesive fibers such as to provide a compressive force conforming the overhanging gasket structure to an underlying surface to which it is attached, such as may be beneficial in certain exemplary applications for containing fluids that have lower surface tensions including alcohols and oils, for example.

Figure 6:
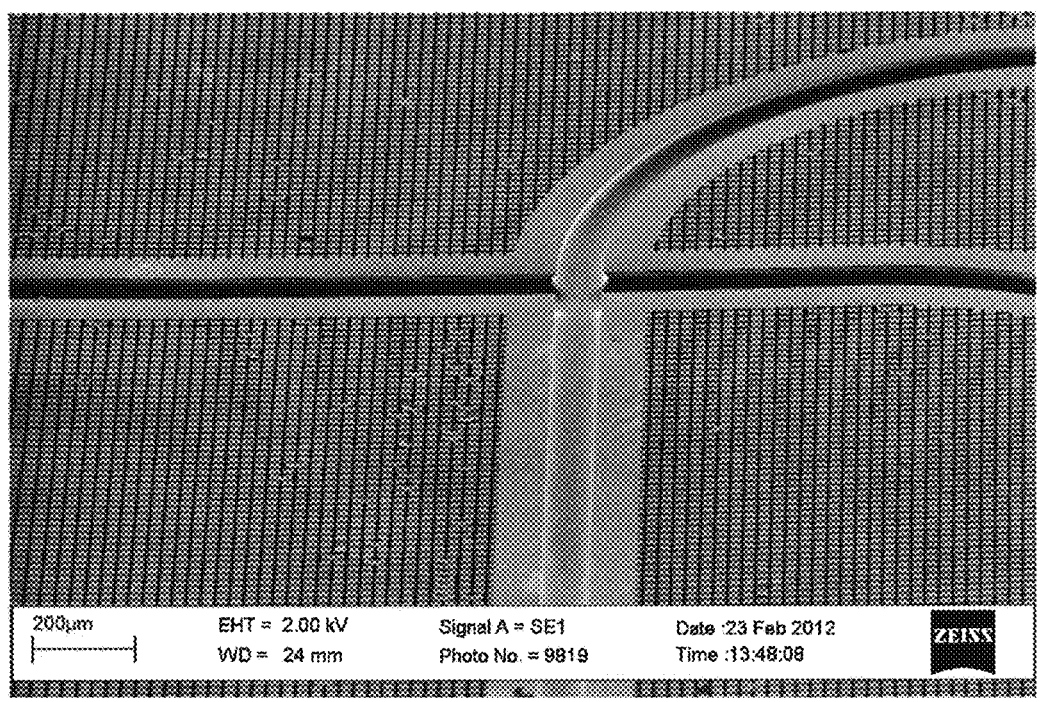
FIG. 6 illustrates a scanning electron micrograph perspective view of a reversible bonded microfluidic structure comprising multiple channels with continuous channel walls and overhanging gasket structures, a t-intersection, and adjacent dry adhesive structures, according to an embodiment of the present invention.
Figure 7:
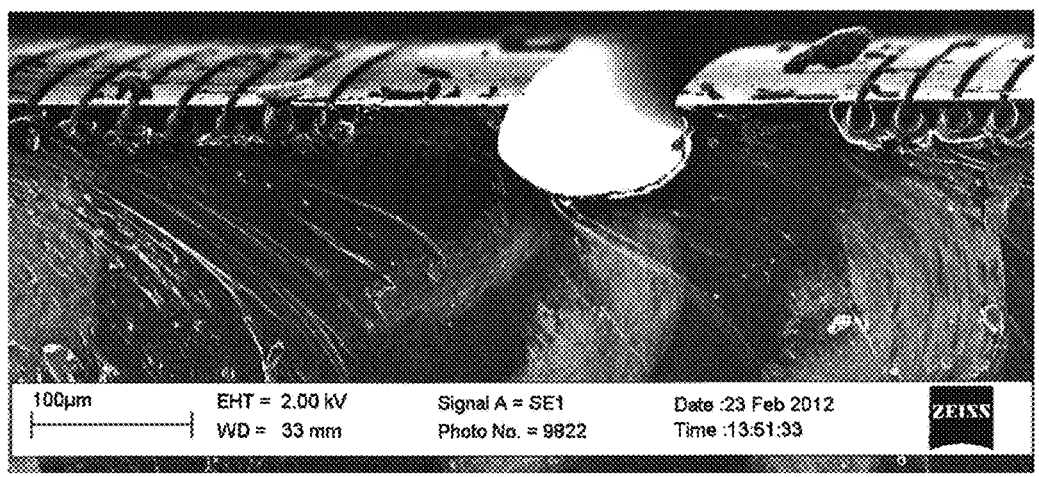
FIG. 7 illustrates a scanning electron micrograph cross-sectional view of a reversible bonded microfluidic structure comprising a microfluidic channel with continuous channel walls with overhanging gasket structures, and adjacent dry adhesive structures, according to an embodiment of the present invention.

Referring to FIG. 6, a scanning electron micrograph perspective view of a reversible bonded microfluidic structure according to an embodiment of the present invention is illustrated, comprising multiple channels with continuous channel walls and overhanging gasket structures, a t-intersection, and adjacent dry adhesive structures. Similarly, FIG. 7 illustrates a scanning electron micrograph cross-sectional view of a reversible bonded microfluidic structure, according to an embodiment of the present invention, and similar to that shown in FIG. 6, comprising a microfluidic channel with continuous channel walls with overhanging gasket structures, and adjacent dry adhesive structures. In one embodiment, a substantially rigid backing surface (such as a glass or plastic or other suitable substantially rigid surface) may be reversibly and/or permanently bonded to the microfluidic structure such as to provide for adhesion of the dry adhesive fibers and caps to act against fluid pressure within the microfluidic channel to seal the channel to the backing surface. In one embodiment, the substantially rigid backing surface may additionally be substantially transparent, such as for use in exemplary applications where visibility of a fluid in the one or more fluid channels of the reversible bonded microfluidic structure is desired, for example.

In one embodiment, in addition to reversible bonding of the dry adhesive and channel wall gasket features to a backing surface, a permanent adhesive material, such as a cyanoacrylate or other suitable adhesive, may be applied to at least one portion of the microfluidic channel structure so as to permanently bond the structure to the backing surface, desirably increasing the strength and/or pressure capacity of the microfluidic channel. In one such embodiment, a permanent adhesive material such as a cyanoacrylate or other suitable adhesive may be applied to the dry adhesive fiber structures outside a fluidic channel wall gasket and allowed to be wick into and between the dry adhesive fiber structures on the outside of the fluidic channel wall gasket of the microfluidic structure and to bond to the backing surface, such as to more permanently bond the open fluidic channel structure to the backing surface. In a particular such embodiment, the permanent adhesive material may desirably be contained to either inside or outside of the fluidic channel wall gasket structure, so as to provide for prevention of unwanted filling of the fluidic channel with permanent adhesive in a permanently bonded application, for example.

Figure 8:
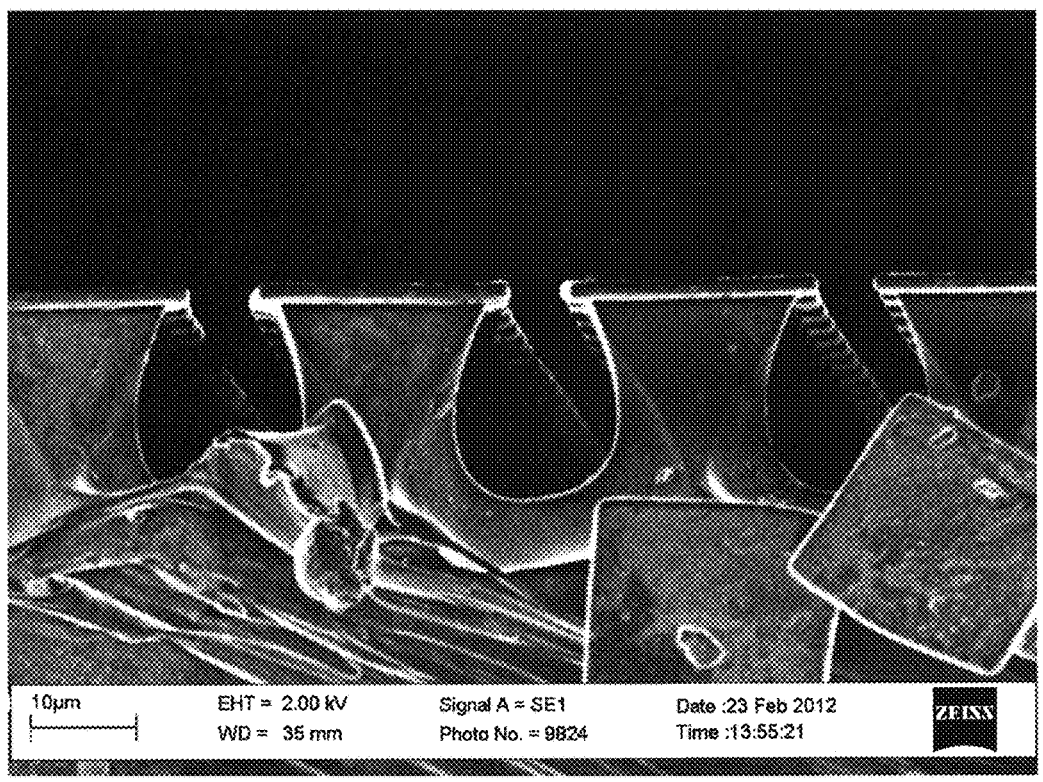
FIG. 8 illustrates a scanning electron micrograph cross-sectional view of a reversible bonded dry adhesive structure with overhanging caps, as part of a reversible bonded microfluidic structure according to an embodiment of the invention.

In a further embodiment, FIG. 8 illustrates another scanning electron micrograph cross-sectional view of a reversible bonded dry adhesive structure according to an embodiment of the present invention, comprising overhanging caps and tapered fiber sidewalls, as part of a reversible bonded microfluidic structure according to an embodiment of the invention.

Figure 9:
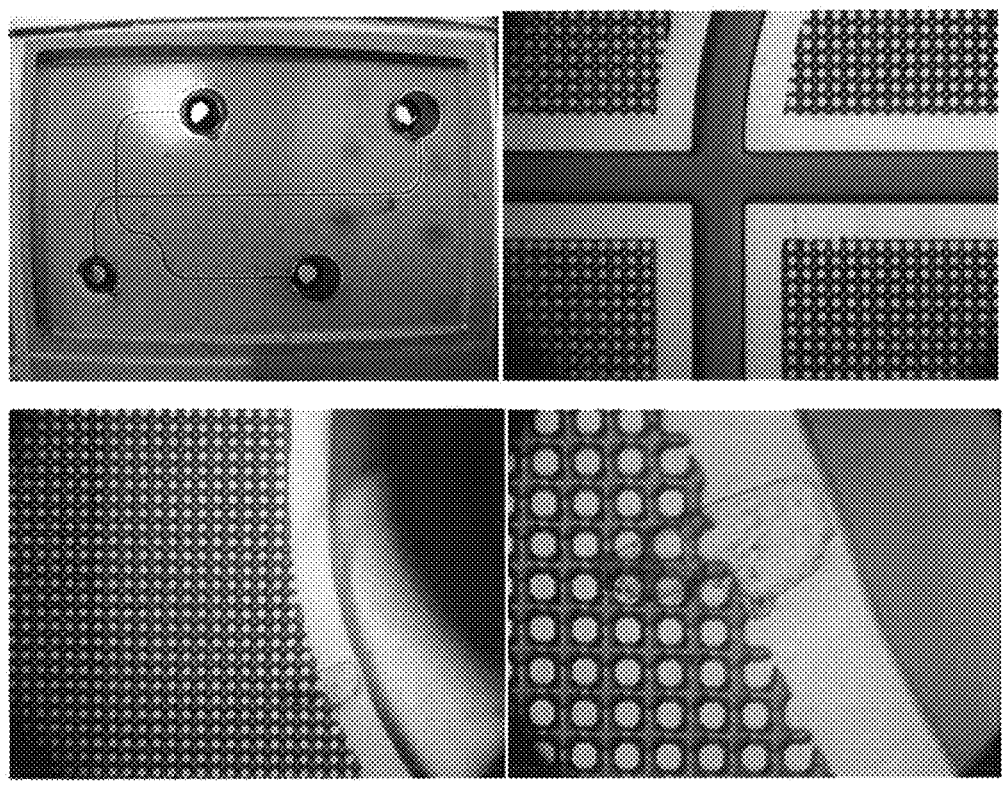
FIG. 9 illustrates an enlarged optical perspective view of a reversible bonded microfluidic structure comprising multiple reservoirs, multiple channels with continuous channel walls and overhanging gasket structures, a t-intersection, and adjacent dry adhesive structures, according to an embodiment of the present invention.

Referring to FIG. 9, an enlarged optical perspective view of a reversible bonded microfluidic structure according to an embodiment of the invention is illustrated, comprising multiple reservoirs, multiple channels with continuous channel walls and associated overhanging gasket structures, a t-intersection, and adjacent dry adhesive structures with overhanging and/or interlocking cap structures. In one embodiment, in addition to reversible bonding of the dry adhesive and channel wall gasket features to a backing surface, a permanent adhesive material, such as a cyanoacrylate or other suitable adhesive, may be applied to at least one portion of the microfluidic channel structure so as to permanently bond the structure to the backing surface and increase the strength and/or pressure capacity of the microfluidic channel. In one such embodiment, a permanent adhesive material such as a cyanoacrylate or other suitable adhesive may be applied to the dry adhesive fiber structures outside a fluidic channel wall gasket and allowed to be wick into and between the dry adhesive fiber structures on the outside of the fluidic channel wall gasket of the microfluidic structure and to bond to the backing surface, such as to more permanently bond the open fluidic channel structure to the backing surface.

The exemplary embodiments herein described, including what is described in the Abstract, are not intended to be exhaustive or to limit the scope of the invention to the precise forms disclosed. They are chosen and described to explain the principles of the invention and its application and practical use to allow others skilled in the art to comprehend its teachings. As will be apparent to those skilled in the art in light of the foregoing disclosure, various equivalent alterations and modifications are possible in the practice of this invention without departing from the scope of the disclosure.

Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment. Further, the described features, structures, or characteristics of the present disclosure may be combined in any suitable manner in one or more embodiments. In this Detailed Description, numerous specific details are provided for a thorough understanding of embodiments of the disclosure. One skilled in the relevant art will recognize, however, that the embodiments of the present disclosure can be practiced without one or more of the specific details, or with other methods, components, materials, and so forth. In other instances, well-known structures, materials, or operations are not shown or described in detail to avoid obscuring aspects of the present disclosure.

The scope of the present disclosure fully encompasses other embodiments and is to be limited, accordingly, by nothing other than the appended claims, wherein any reference to an element being made in the singular is intended to mean "one or more", and is not intended to mean "one and only one" unless explicitly so stated. All structural and functional equivalents to the elements of the above-described preferred embodiment and additional embodiments are hereby expressly incorporated by reference and are intended to be encompassed by the present claims. Moreover, no requirement exists for an apparatus or method to address each and every problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, that various changes and modifications in form, material, work-piece, and fabrication material detail may be made, without departing from the spirit and scope of the present disclosure, as set forth in the appended claims, are also encompassed by the present disclosure.

What is claimed is:

1. A reversible bonded microfluidic structure comprising: a base structure; a continuous microfluidic channel wall comprising an overhanging gasket structure forming at least one microfluidic channel; a plurality of dry adhesive fiber structures substantially adjacent to said microfluidic channel wall and extending from said base structure; and a plurality of overhanging cap structures corresponding to and situated atop said fiber structures adapted for reversible bonding of said microfluidic structure to a support surface.

2. The reversible bonded microfluidic structure according to claim 1, wherein said at least one microfluidic channel comprises at least one of a microfluidic chamber and a microfluidic reservoir.

3. The reversible bonded microfluidic structure according to claim 1, wherein said microfluidic structure comprises at least one of: a reversible bonded micro-mixer; and a reversible bonded electrophoresis capillary channel further comprising at least one electrode.

4. The reversible bonded microfluidic structure according to claim 1, wherein at least one of said microfluidic channel wall, said dry adhesive fiber structures and said overhanging cap structures comprise a flexible polymer material.

5. The reversible bonded microfluidic structure according to claim 1, wherein said microfluidic structure comprises a thermoplastic microfluidic structure and said flexible polymer material comprises at least one of: a thermoplastic polymer and a thermoplastic elastomer.

6. The reversible bonded microfluidic structure according to claim 1, wherein at least a portion of said dry adhesive fiber structures are substantially hydrophilic and at least a portion of said overhanging cap structures are substantially hydrophobic.

* * * * *